United States Patent
Kelman

(10) Patent No.: US 7,910,462 B2
(45) Date of Patent: Mar. 22, 2011

(54) GROWING [110] SILICON ON [001] ORIENTED SUBSTRATE WITH RARE-EARTH OXIDE BUFFER FILM

(75) Inventor: Maxim B. Kelman, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 490 days.

(21) Appl. No.: 11/582,048

(22) Filed: Oct. 16, 2006

(65) Prior Publication Data

US 2007/0037329 A1 Feb. 15, 2007

Related U.S. Application Data

(62) Division of application No. 10/956,283, filed on Sep. 30, 2004, now Pat. No. 7,199,451.

(51) Int. Cl.
*H01L 21/20* (2006.01)
*C30B 25/18* (2006.01)

(52) U.S. Cl. ............. 438/479; 117/101; 257/E21.131; 438/973

(58) Field of Classification Search ........... 438/197, 438/199, 689, 150, 198, 478–479, 481, 973, 438/982; 257/64, E21.131–E21.132; 117/101, 117/902
See application file for complete search history.

(56) References Cited

U.S. PATENT DOCUMENTS

| | | | |
|---|---|---|---|
| 6,749,686 B2 | 6/2004 | Ami et al. | |
| 6,897,095 B1 * | 5/2005 | Adetutu et al. | 438/119 |
| 6,972,478 B1 * | 12/2005 | Waite et al. | 257/627 |
| 7,208,815 B2 * | 4/2007 | Chen et al. | 257/627 |
| 7,344,934 B2 * | 3/2008 | Li | 438/199 |
| 2002/0119659 A1 * | 8/2002 | Ami et al. | 438/689 |
| 2005/0009306 A1 * | 1/2005 | Mitani et al. | 438/479 |
| 2005/0214954 A1 * | 9/2005 | Maruyama et al. | 438/3 |
| 2006/0261352 A1 * | 11/2006 | Takahashi et al. | 257/79 |
| 2007/0004113 A1 * | 1/2007 | King et al. | 438/197 |
| 2007/0018166 A1 * | 1/2007 | Atanackovic et al. | 257/64 |
| 2007/0023780 A1 * | 2/2007 | Ohmi et al. | 257/190 |
| 2007/0090467 A1 * | 4/2007 | Zhu | 257/390 |
| 2007/0179063 A1 * | 8/2007 | Malozemoff et al. | 505/329 |

FOREIGN PATENT DOCUMENTS

JP 2000-281494 10/2000

* cited by examiner

*Primary Examiner* — Matthew W Such
(74) *Attorney, Agent, or Firm* — Blakely, Sokoloff, Taylor & Zafman LLP

(57) ABSTRACT

An assembly and method of making the same wherein the assembly incorporates a rare-earth oxide film to form a [110] crystal lattice orientation semiconductor film. The assembly comprises a substrate, a rare-earth oxide film formed on the substrate, and a [110]-oriented semiconductor film formed on the rare-earth oxide film. The rare-earth oxide film having a [110] crystal lattice orientation. The substrate has a [001] crystal lattice orientation.

11 Claims, 8 Drawing Sheets

GROWING [110] SILICON ON [001] ORIENTED SUBSTRATE WITH RARE-EARTH OXIDE BUFFER FILM

This is a Divisional of application Ser. No. 10/956,283, filed on Sep. 30, 2004 now U.S. Pat. No. 7,199,451.

FIELD

Embodiments of the present invention relate to making electronic devices such as semiconductor devices.

BACKGROUND

A type of integrated circuit widely used for micro electronic devices (e.g., processors and memories) is Complementary Metal Oxide Semiconductor (CMOS) which uses N-Channel MOS (N-MOS) and P-Channel MOS (P-MOS) devices or transistors built on the same substrate (FIG. 1). Such devices are often made on semiconductor substrates such as silicon wafers.

There are different crystal lattice orientations in a semiconductor substrate depending on the cut of the semiconductor substrate. Examples of several crystal lattice orientation include [001], [100], and [110]. Optimally, a CMOS device should be such that it has a high electron mobility for a high performance N-MOS device and a high hole mobility for a high performance P-MOS device. The mobility of electrons or holes depends significantly on the orientation of the crystal lattice of the semiconductor substrate. For example, for a device (e.g., a transistor) to have a high electron mobility, the channel of the transistor where electrons travel across should lie along a [001]-type plane. For a device (e.g., a transistor) to have a high hole mobility, the channel of the transistor should be parallel to a [110]-type plane. Thus, it is desirable to form N-MOS devices on [001] crystal planes to maximize the electron mobility and P-MOS devices on [110] crystal planes to maximize the hole mobility. Currently, as shown in FIG. 1, both P-MOS and the N-MOS devices are often made on the same semiconductor substrate (e.g., a 100-oriented silicon substrate) and thus the mobility for both the electrons and holes cannot be maximized. Under the current practice, manufacturers compensate for the low hole mobility in a substrate by making P-MOS devices bigger so that the drive current is relatively the same for both the N-MOS and the P-MOS devices made on the same substrate. As devices approach smaller and smaller dimension, compensating for the hole mobility by increasing the P-MOS dimension is impractical and undesirable.

Under the current practice, a dual orientation substrate (e.g., a substrate with a [001] orientation surface area and a [110] orientation surface area) is created by bonding two differently oriented silicon wafers together to form a silicon-on-insulator substrate using methods known in the art (e.g., using SMARTCUT, Bonded and Etch Back Silicon On Insulator (BESOI), or Separation by Implantation of Oxygen). FIG. 2 shows a [110] orientation silicon wafer being bonded to a [001] orientation silicon wafer with a silicon oxide ($SiO_2$) film formed between the two wafers. Alternatively, a [001] orientation silicon wafer is bonded to a [110] orientation silicon wafer with a silicon oxide ($SiO_2$) film formed between the two wafers (FIG. 3). Next, one wafer is then thinned (e.g., using Chemical Mechanical Polishing, CMP) as shown in FIG. 4 (certain area of the [110] orientation silicon wafer is thinned) and in FIG. 5 (certain area of the [001] orientation silicon wafer is thinned). Next, an epitaxial silicon film is formed on the wafer as shown in FIGS. 6-7. As shown in FIGS. 6-7, the substrate has an area of [001] orientated silicon and an area of [110] orientated silicon. The P-MOS device can then be formed on the [110] oriented silicon region and the N-MOS device can then be formed on the [001] oriented silicon region to form the device shown in FIG. 1.

The current practice generates material wastes and high cost in making a dual orientation substrate for the fabrication of N-MOS and the P-MOS devices on the same substrate. The processes of wafer bonding and the material wasted in these processes drive the cost of making the devices high. Additionally, the thickness uniformity of the device substrates is more difficult to control, for example, due to the accuracy limitation of the thinning process.

BRIEF DESCRIPTION OF THE DRAWINGS

The embodiments of the present invention are illustrated by way of example and not by way of limitation in the figures of the accompanying drawings in which like references indicate similar elements. The invention may best be understood by referring to the following description and accompanying drawings that are used to illustrate embodiments of the invention. It should be noted that references to "an" or "one" embodiment of the invention in this disclosure are not necessarily to the same embodiment, and they mean at least one. In the drawings.

DETAILED DESCRIPTION

Figure 1:
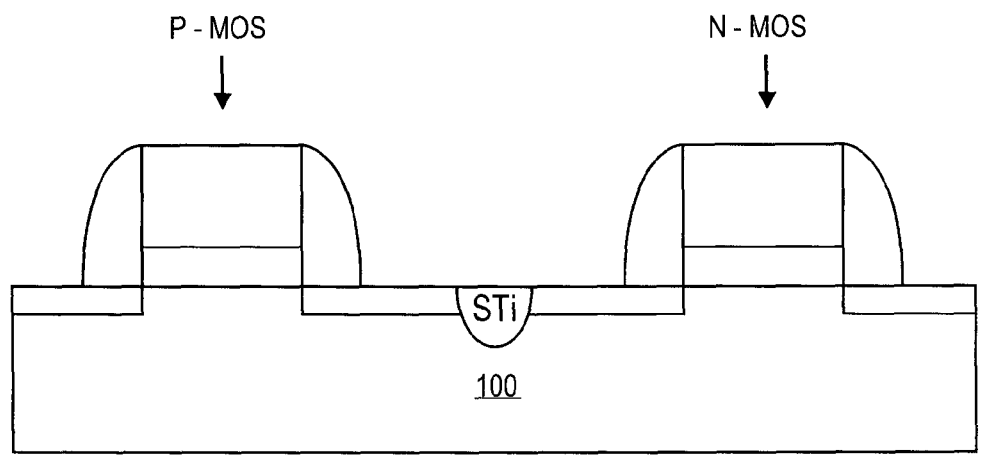
FIG. 1 illustrates an exemplary device having both a P-MOS and an N-MOS devices built on the same substrate.
Figure 2:
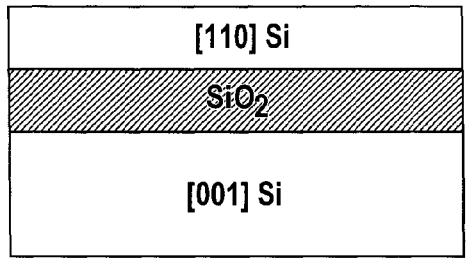
FIGS. 2-7 illustrate an current practice of forming a dual orientation substrate having a [110] orientation and a [001] orientation silicon surface.
Figure 3:
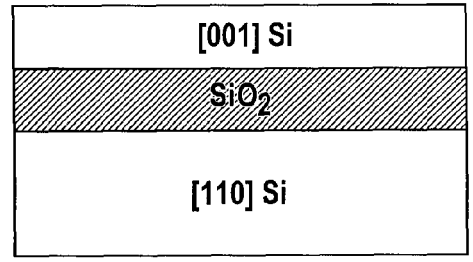
Figure 4:
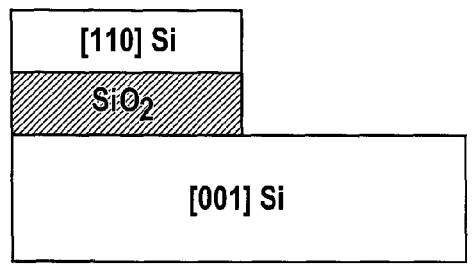
Figure 5:
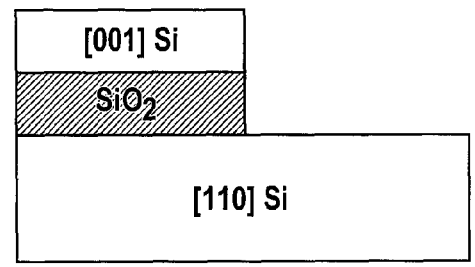
Figure 6:
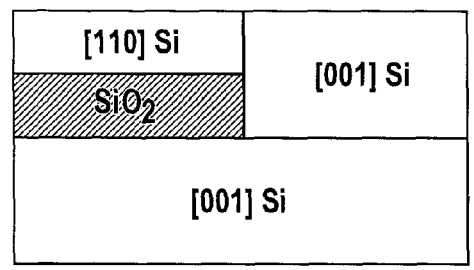
Figure 7:
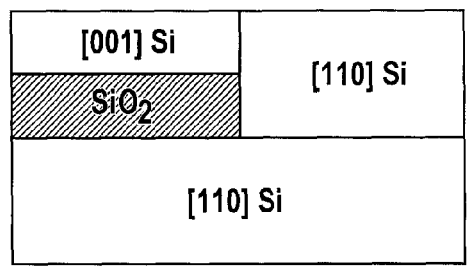

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

Embodiments of the present invention pertain to optimizing performance of one or more P-MOS devices and N-MOS devices built on the same substrate by optimizing hole and electron mobility. Each of the P-MOS and the N-MOS devices is built on a differently oriented surface on the substrate to take advantage of the higher hole mobility on the [110] type orientation surface for the P-MOS devices and higher electron mobility [001] type orientation surface for the N-MOS devices. In more particular, the embodiments of the present invention pertain to a dual orientation substrate that has a [001] type orientation semiconductor (e.g., silicon) surface and [110] type orientation semiconductor (e.g., silicon) surface. A dual orientation substrate of the embodiments of the present invention includes a [001]-oriented semiconductor substrate and a portion or an area of the [001]-oriented semiconductor substrate includes a rare-earth oxide film having a crystal lattice of [110] orientation ([110]-oriented rare-earth oxide film) formed on the substrate and a [110]-oriented semiconductor film formed on top of the [110]-oriented rare-earth oxide film. The semiconductor substrate can be a silicon-containing substrate and the semiconductor film can also be a silicon-containing film. The rare-earth oxide can be Yttrium oxide, Scandium oxide, Cerium oxide, Lanthanum oxide, Praseodymium oxide, Thorium oxide, or Actinium oxide, to name a few. Other suitable rare-earth oxide can also be used.

To form the dual orientation substrate, the [110]-oriented rare-earth oxide film is formed (e.g., blanket deposition) on the surface of the [001]-oriented semiconductor substrate and the [110]-oriented semiconductor film is formed on the [001]-oriented rare-earth oxide film. When formed on a semiconductor surface such as a silicon surface, the rare-earth oxide film is formed with a [110] orientation. In one embodiment, an epitaxial silicon film is deposited on the rare-earth oxide film and the silicon film mimics the [110]-oriented crystal lattice of the rare-earth oxide film. Thus, the silicon film has a [110]-oriented crystal lattice. Then, an area of the [110]-oriented semiconductor film and the [110]-oriented rare-earth oxide film are removed to expose the [001]-oriented semiconductor substrate. The dual orientation substrate is thus formed having both the [001]-oriented semiconductor crystal lattice and the [110]-oriented semiconductor crystal lattice.

Alternatively, to form the dual orientation substrate, the [110]-oriented rare-earth oxide film is formed over a portion of the surface of the [001]-oriented semiconductor substrate and the [110]-oriented semiconductor film is formed on the [110]-oriented rare-earth oxide film. The substrate now has a surface with a [001]-oriented crystal lattice and a surface of [110]-oriented crystal lattice. The P-MOS device is formed on the [110]-oriented semiconductor film in which the hole mobility is maximized and/or optimized and the N-MOS is formed on the [001]-oriented semiconductor film in which the electron mobility is maximized and/or optimized.

Figure 8:
FIGS. 8-11 illustrate an exemplary process of making a dual orientation substrate in accordance to embodiments of the present invention.
Figure 9:
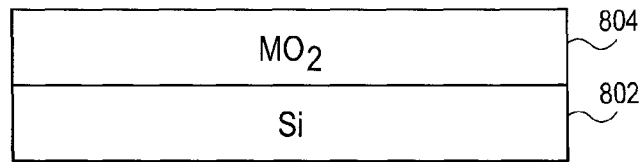

FIGS. 8-12 illustrate exemplary processes of making a dual orientation substrate incorporating a rare-earth oxide film. In FIG. 8, a [001]-oriented silicon substrate 802 is provided. Other [001]-oriented semiconductor substrates can also be used. The [001]-oriented silicon substrate 802 may include a silicon oxide film (not shown). In FIG. 9, a rare-earth oxide (MOx) film 804 is formed on the [001]-oriented silicon substrate 802. The rare-earth oxide film 804 may be Yttrium oxide ($Y_2O_3$), Scandium oxide ($Sc_2O_3$), Cerium oxide ($CeO_2$), Lanthanum oxide ($La_2O_3$), Praseodymium oxide ($Pr_2O_3$), Thorium oxide ($ThO_2$), or Actinium oxide ($Ac_2O_3$), or any combination thereof. Other rare-earth oxide material can also be used. In one embodiment, the rare-earth oxide film 804 is an epitaxial film grown using methods known in the art such as Electron Beam Evaporation or Molecular Beam Evaporation. The rare-earth oxide film when formed on a silicon substrate or a silicon oxide substrate forms a film with [110]-oriented crystal lattice. The rare-earth oxide film 804 thus is formed on the silicon substrate 802 with a [110]-oriented crystal lattice. In one embodiment, the rare-earth oxide film 804 has a thickness of about 50 angstroms or more. The thickness of the rare-earth oxide film 804 may also be less in certain applications. In one embodiment, the rare-earth oxide film 804 is formed over the entire surface of the silicon substrate 802 (e.g., blanket deposition) as shown in FIG. 9. The rare-earth oxide film 804 can be about 50 angstrom or more. The rare-earth oxide film 804 can also be thinner than 50 angstrom if desired. The thickness of the rare-earth oxide film 804 may be such that it is sufficient for a silicon film to form on top of the rare-earth oxide film 804 to mimic the [110]-oriented crystal lattice of the film 804.

Figure 10:
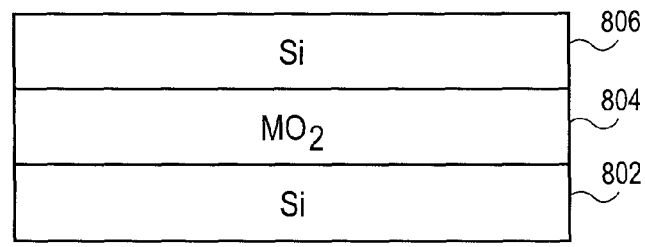

In FIG. 10, a silicon film 806 is formed on the rare-earth oxide film 804. The silicon film 806 mimics the crystal lattice of the rare-earth oxide film 804 and thus the silicon film 806 has a [110]-oriented crystal lattice. In one embodiment, the silicon film 806 is formed as an epitaxial film using methods known in the art such as chemical vapor deposition. The silicon film 806 is formed over the entire surface of the rare-earth oxide film 804.

Figure 11:
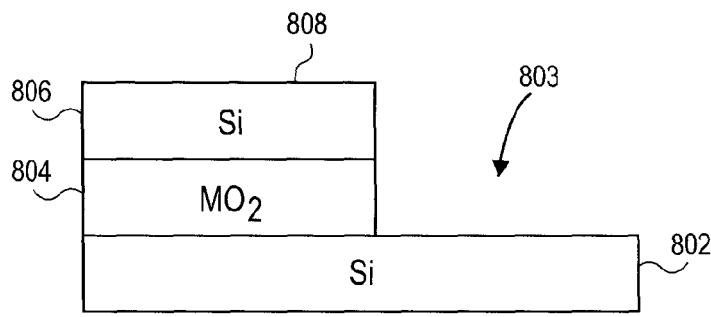
Figure 12:
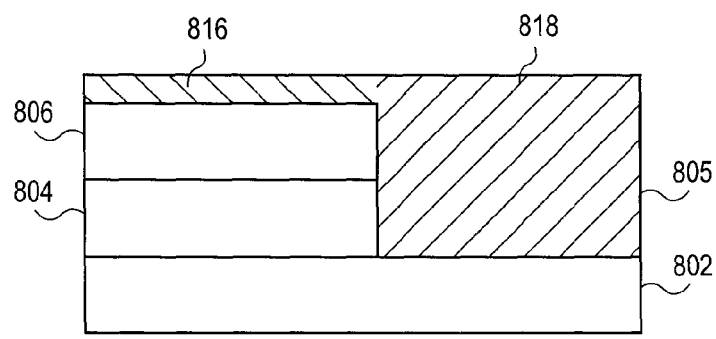
FIGS. 12-18 illustrate another exemplary process of making a dual orientation substrate in accordance to embodiments of the present invention.

In FIG. 11, an area of the rare-earth oxide film 804 and the silicon film 806 is removed so that a [001]-oriented silicon surface can be made available. In one embodiment, the rare-earth oxide film 804 and the silicon film 806 are patterned or etched using conventional methods to provide a [001]-oriented silicon portion 803. The remaining area of the rare-earth oxide film 804 and the silicon film 806 is labeled as portion 808 in FIG. 11. In one embodiment, before the structure is ready for use, an epitaxial silicon film 805 may be formed over the entire portion, over the [001]-oriented silicon surface 803 and over the [110]-oriented silicon portion 808 as shown in FIG. 12. As before, the silicon film mimics the crystal lattice structure of the underlying film. Thus, a portion 816 of the silicon film 805 has a [110]-oriented crystal lattice since it is formed over the [110]-oriented silicon portion 808; and, a portion 818 of the silicon film 805 has a [001]-oriented crystal lattice since it is formed over the [001]-oriented silicon surface. In one embodiment, the surface of the structure shown in FIG. 12 is polished, for example, using Chemical Mechanical Polishing to provide a smooth or planarized surface for the fabrication of the P-MOS and N-MOS devices.

Figure 13:
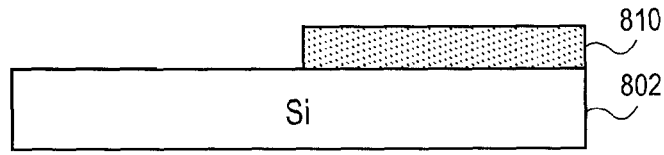
Figure 14:
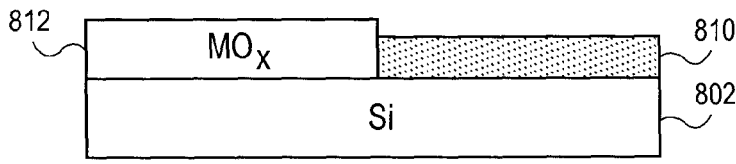

FIGS. 13-19 illustrate another exemplary embodiment of making a dual orientation substrate incorporating a rare-earth oxide film. In an alternative embodiment, a mask such as a photoresist film or a hard mask may be used to mask out an area of the [001]-oriented silicon substrate 802 prior to the formation of the rare-earth oxide film and the silicon film. In FIG. 13, a substrate 802 is provided and includes a mask 810 formed over the substrate 802 using methods known in the art. In one embodiment, the mask 810 is a photoresist mask. In another embodiment, a hard mask containing nitride or oxide can be used. Other hard mask can also be used. In FIG. 14, a rare-earth oxide film 812 is formed over the unmasked area of the substrate 802 using methods known in the art such as Electron Beam Evaporation or Molecular Beam Evaporation. The rare-earth oxide film 812 when formed on the silicon substrate 802 has a [110]-oriented crystal lattice. In one embodiment, the rare-earth oxide film 812 has a thickness of about 50 angstrom or more. The rare-earth oxide film 812 can be thinner than 50 angstrom if desired. The thickness of the rare-earth oxide film 812 may be such that it is sufficient for a silicon film to form on top of the rare-earth oxide film 812 to mimic the [110]-oriented crystal lattice of the film 812. Although it is not shown, some rare-earth oxide film may be formed over the mask 810, especially when the rare-earth oxide film is blanket deposited.

Figure 15:
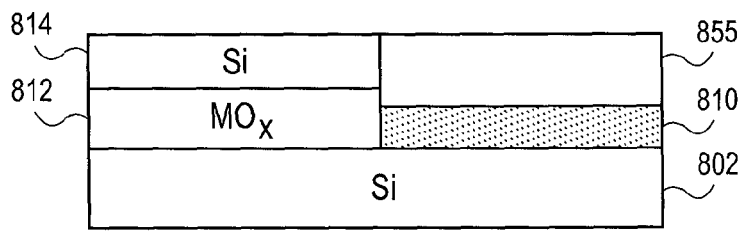
Figure 16:
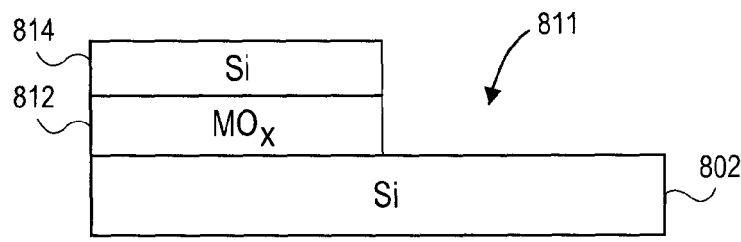
Figure 17:
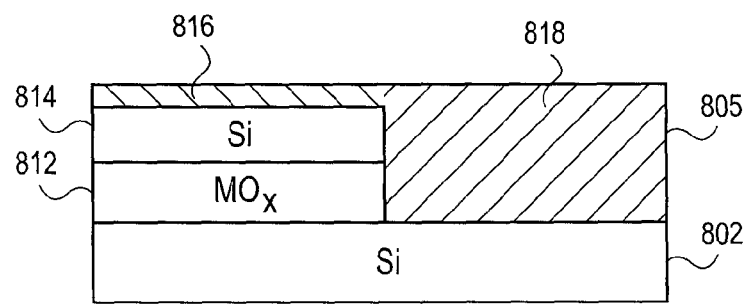

In FIG. 15, a silicon film 814 is formed on the rare-earth oxide film 812. The silicon film 814 may be blanket deposited so that silicon film 855 is also formed on top of the mask 810. The silicon film 855 that is formed on top of the mask 810 may be polysilicon. The silicon film 814 that is formed on the rare-earth oxide film 812 mimics the crystal lattice of the rare-earth oxide film 812 and thus the silicon film 814 has a [110]-oriented crystal lattice. In one embodiment, the silicon film 814 is formed as an epitaxial film using methods known in the art such as chemical vapor deposition. In FIG. 16, the mask 810 and the silicon film 855 are removed exposing the [001]-oriented silicon portion 811 of the substrate 802. The structure shown in FIG. 16 thus includes dual orientation surfaces with the [110]-oriented silicon film 814 and the [001]-oriented silicon portion 818. Before the structure is ready for use, an epitaxial silicon film 805 may be formed over the entire surface including over the [110]-oriented silicon film 814 and the [001]-oriented portion 811 of the silicon substrate 802 (FIG. 17). As before, the silicon film mimics the crystal lattice structure of the underlying film. Thus, a portion 816 of the silicon film 805 has a [110]-oriented crystal lattice since it is formed over the [110]-oriented silicon film 814; and, a portion 818 of the silicon film 805 has a [001]-oriented crystal lattice since it is formed over the [001]-oriented silicon surface. In one embodiment, the surface of the structure shown in FIG. 17 is polished, for example, using Chemical Mechanical Polishing to provide a smooth or planarized surface for the fabrication of the P-MOS and N-MOS devices.

Figure 18:
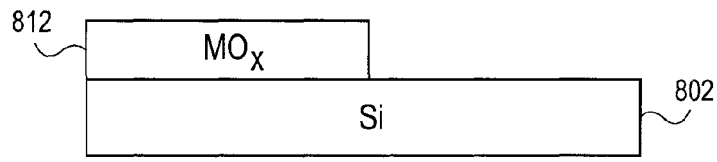
Figure 19:
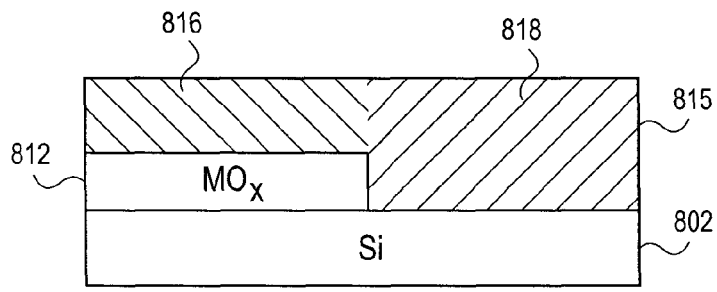
FIGS. 19-34 illustrate an exemplary process of making a P-MOS device and an N-MOS device on the same substrate in accordance to embodiments of the present invention.
Figure 20:
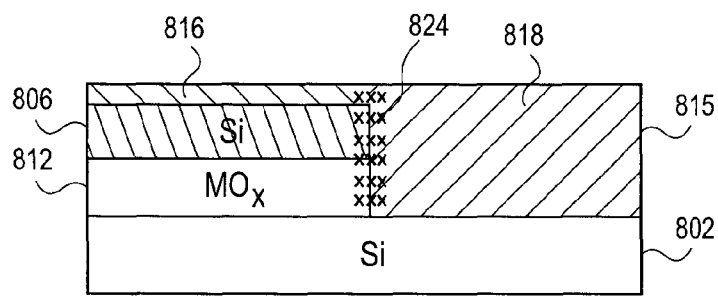

In an alternative embodiment, the mask 810 is removed after the formation of the [110]-oriented rare-earth oxide film 812 (FIG. 14) and prior to the formation of the silicon film 814 (FIG. 18). In the present embodiment, a silicon film 815 is then formed epitaxially over the entire surface to create a planar surface (FIG. 19). The portion 816 of the silicon film 815 that is formed over the rare-earth oxide film 812 forms a [110]-oriented silicon film since it mimics the orientation of the underlying [110]-oriented rare-earth oxide film 812. The portion 818 of the silicon film 815 that is formed over the silicon substrate [001]-oriented forms a [001]-oriented silicon film since it mimics the orientation of the underlying [001]-oriented silicon substrate 802. The resulting structure shown in FIG. 19 is essentially the same as the resulting structure shown in FIG. 17 previously described. Both structures may further be polished to provide a smooth surface for fabrication of devices.

Figure 33:
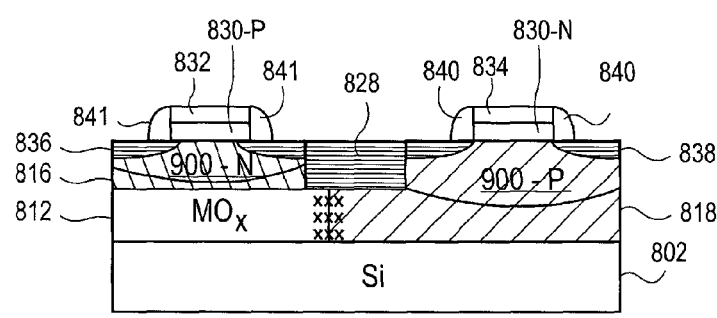
Figure 34:
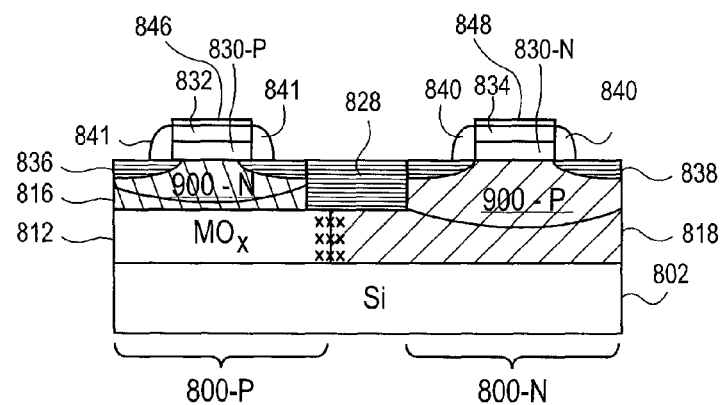

FIGS. 20-34 illustrate an exemplary process of fabricating an N-MOS device 800-N and a P-MOS device 800-P on the same substrate 802 (FIG. 34). The substrate 802 has been processed using embodiments of the present invention to create a surface area having a [001]-oriented silicon portion 818 and a surface area having a [110]-oriented silicon portion 816.

Figure 21:
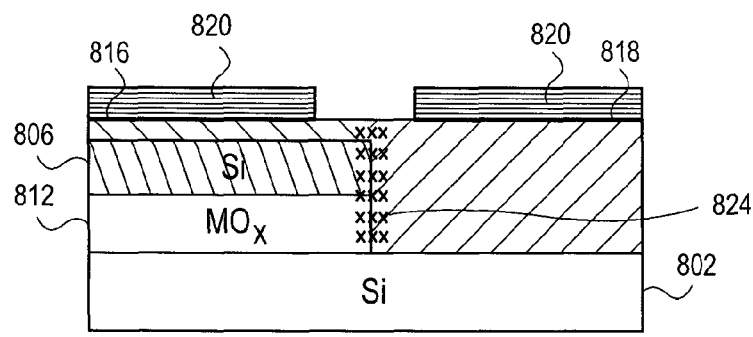
Figure 22:
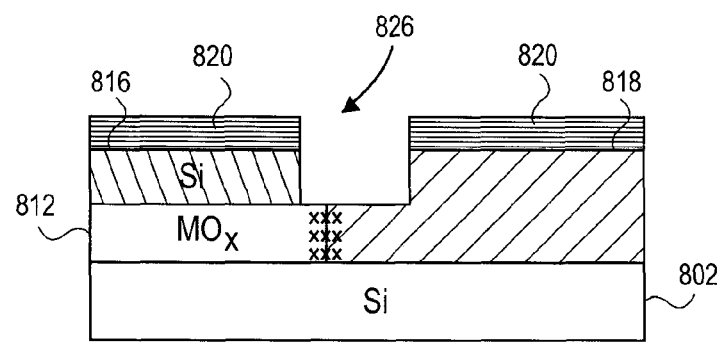
Figure 24:
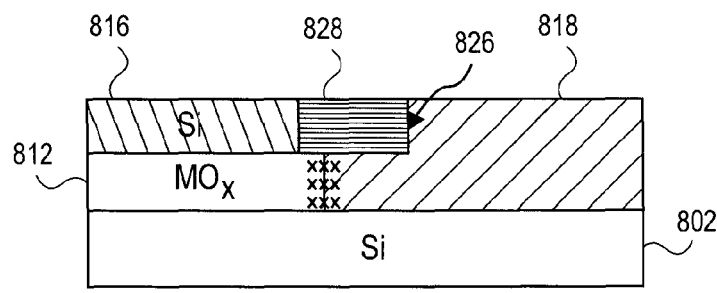

In FIG. 21, a mask 820 (such as a photoresist mask or a hard mask) is formed on the [100]-oriented silicon portion 816 and [001]-oriented silicon portion 818. The mask defines the regions for the P-MOS device 800-P and the N-MOS device 800-N to be formed and a region for isolation between the devices. The mask 820 is formed using methods known in the art (e.g., a suitable photolithographic technique). It is to be noted herein that when the rare-earth oxide film and the silicon film are formed as previously described, there may be a "defect-rich" region 824 formed between the [110]-oriented silicon portion 816 and the [001]-oriented silicon portion 818 (FIG. 18-19). This may be due to the fact that the crystal lattice in this region 824 will be affected by the interfaces between the [110]-oriented silicon portion 816 and the [001]-oriented silicon portion 818 and the rare-earth oxide film 814 and the [001]-oriented silicon portion 818. When that happens, the region 824 can be used to form the isolation between the devices. Thus, the mask 820 is formed or patterned such that at least the defect region 824 is exposed. The defect region 824 is then removed or etched away to create a trench 826. A conventional method suitable for etching or removing silicon can be used to etch away a portion or all of the defect region 824 (e.g., wet etching using KOH etching solution or TMAH etching solution of suitable concentrations or dry etching using a halogen based chemistry). FIG. 22 shows the defect region 824 etched away to form a trench 826. The mask 820 is then removed after the trench 826 is formed (FIG. 22). In FIG. 24, an insulation material 828 is used for fill the trench 826. In one embodiment, a silicon oxide or a silicon nitride material is deposited in the trench 826 using methods known in the art such as high-density plasma. The trench 826 and the insulation material 828 thus form a shallow trench isolation for the devices to be formed on the substrate 802. The surface of the resulting structure shown in FIG. 24 may be polished for example, using chemical mechanical polishing to planarize the surface prior to the fabrication of the P-MOS device 800-P and the N-MOS device 800-N.

Figure 23:
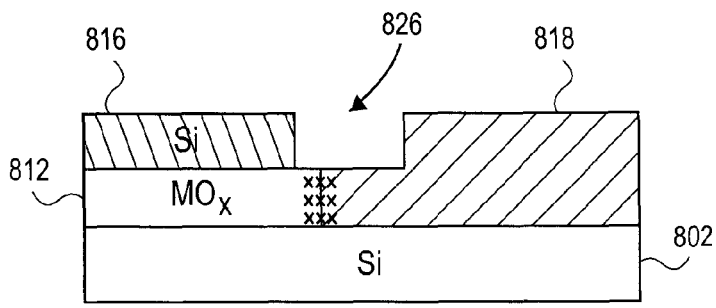

In FIG. 23, P-well and N-well are formed in the respective silicon portion. Impurities are used to implant into the silicon films to create the P-well and the N-well. The P-MOS device 800-P will be formed on the N-well region and the N-MOS device 800-N will be formed on the P-well region. Either the N-well or the P-well can be formed first and other formed second. Implantation methods to form the P-well and N-well are well known in the art.

Figure 25:
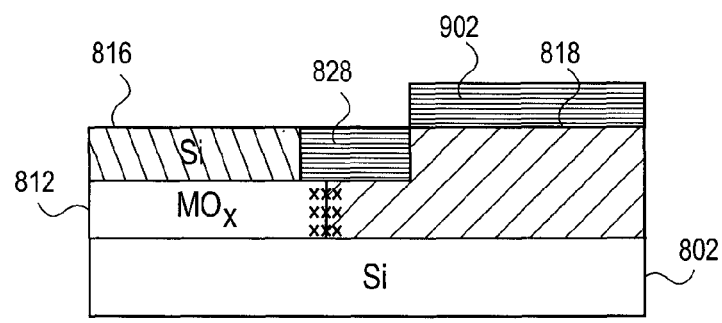
Figure 26:
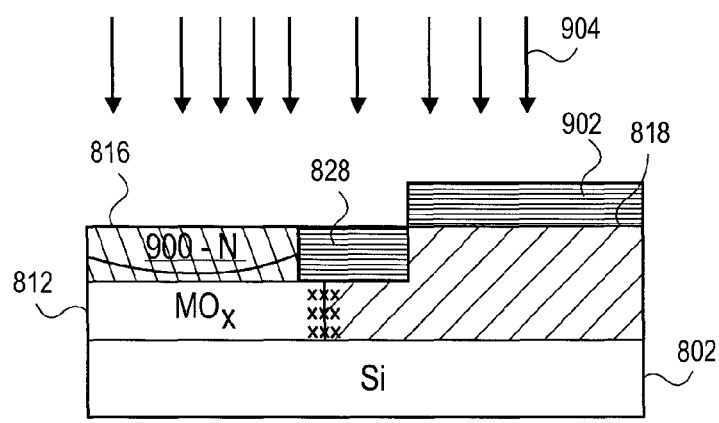
Figure 27:
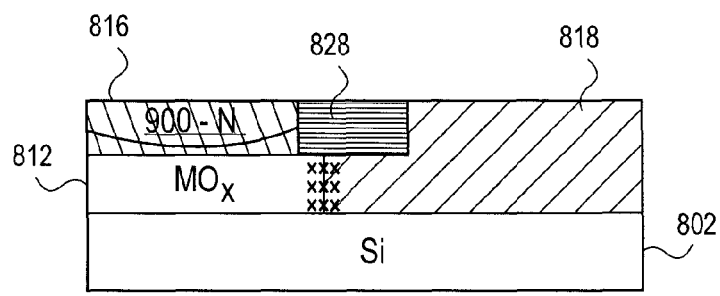
Figure 28:
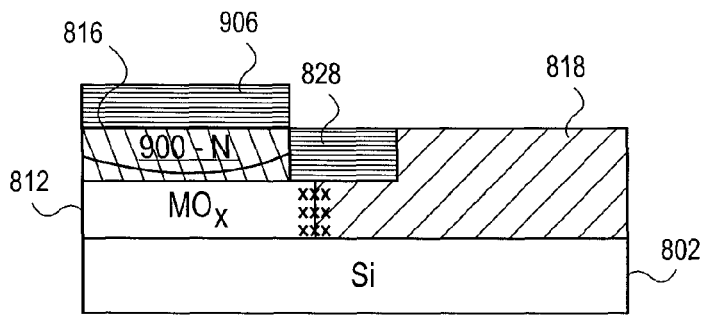
Figure 29:
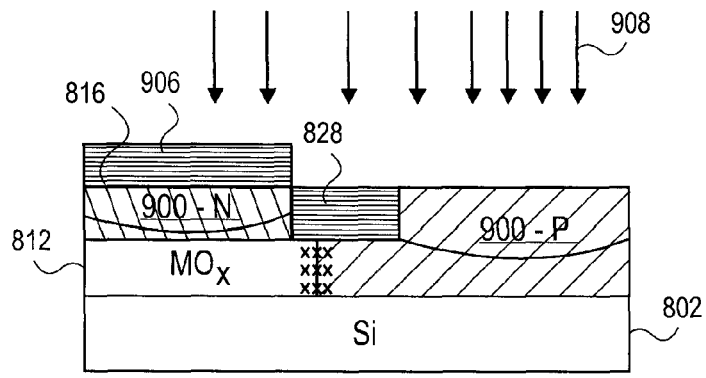
Figure 30:
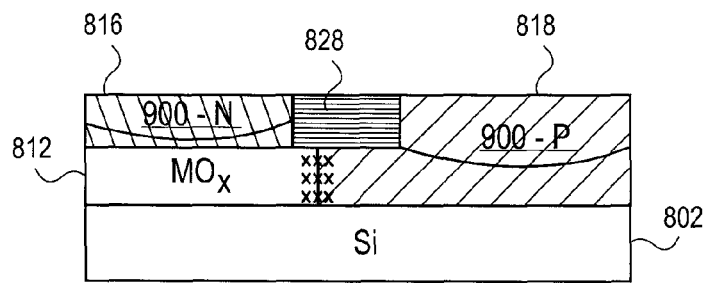

As can be seen in FIG. 34, the P-MOS device 800-P will be formed on the [110]-oriented silicon portion 816 and the N-MOS device 800-N will be formed on the [001]-oriented silicon portion 818. In FIG. 25 a mask, e.g., a photoresist mask 902 is formed/patterned over the [001]-oriented silicon portion 818 so that when dopants are used to form the N-well 900-N for the P-MOS device 800-P, no dopants will be implanted into the [001]-oriented silicon portion 818. In FIG. 26 dopants 904 such as phosphorous (or arsenic or other n-well types) impurities or ions are implanted into the [110]-oriented silicon portion 816 to form the N-well 900-N for the P-MOS device. In FIG. 27, the photoresist mask 902 is removed. In FIG. 28, a photoresist mask 906 is formed/patterned over the [110]-oriented silicon portion 816 so that when dopants are used to form the P-well for the N-MOS device 800-N, no dopants will be implanted into the [110]-oriented silicon portion 816. In FIG. 29 dopants 908 such as boron (or other p-well types) impurities or ions are implanted into the [001]-oriented silicon portion 818 to from the P-well 900-P for an N-MOS device 800-N. In FIG. 30, the photoresist mask 906 is removed. In one embodiment, the boron ions in the P well 900-P and the phosphorous are then diffused at high temperature to drive the ions into the device substrate, thus establishing the desired dopant concentration profile and depth for P-well and the N-well of the devices. The substrate 803 now includes a [110]-oriented silicon portion 816 having the N-well 900-N created therein and a [001]-oriented silicon portion 818 having the P-well 900-P created therein.

Figure 31:
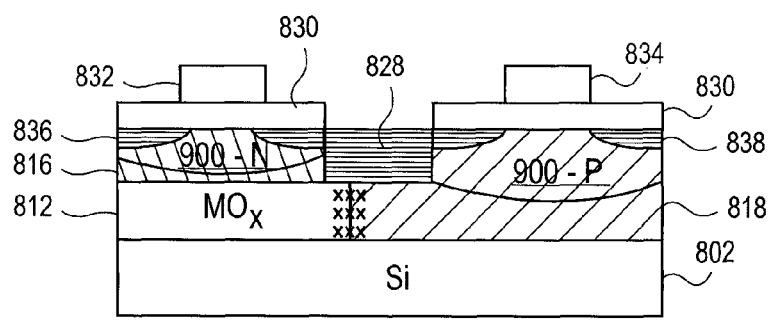

In FIG. 31, an oxide film 830 such as a silicon oxide film is formed over the [110]-oriented silicon portion 816 and the [001]-oriented silicon portion 818. In one embodiment, the oxide film 830 is formed by a thermal growth technique to oxidize a top surface of the silicon portions 816 and 818. The oxide film 830 will form the gate dielectric for each of the P-MOS 800-P and N-MOS 800-N. Next, a gate electrode 832 and a gate electrode 834 are formed on the oxide film 830. In one embodiment, the gate electrodes 832 and 834 are made of polysilicon, which are then doped with appropriate dopants to form the electrodes for the devices. The gate electrodes 832 and 834 can also be made of metals as is known in the art.

In one embodiment, lightly doped source and drain implantation for each of the P-MOS device and the N-MOS device is also done to create the source and drain regions. Thus, source and drain regions 836 are created for the P-MOS device 800-P and source and drain regions 838 are created for the N-MOS device 800-N as shown in FIG. 31. In one embodiment, phosphorous ions are used to implant into the silicon portion 818 to form the source and drain regions 838 for the N-MOS device 800-N. In one embodiment, boron ions are used to implant into the silicon portion 816 to form the source and drain regions 836 for the P-MOS device 800-P.

Figure 32:
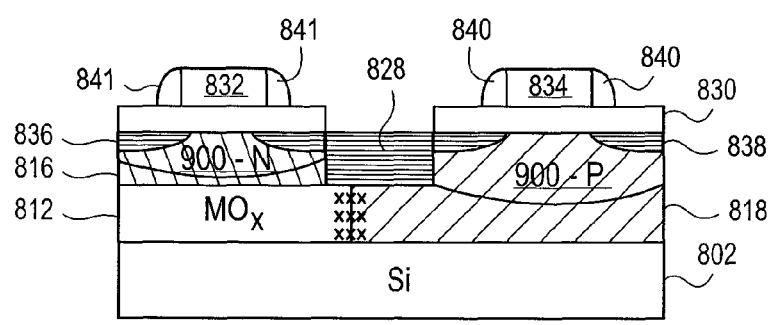

In one embodiment as shown in FIG. 32, sidewall spacers are formed on each side of the gate electrodes 832 and 834. Thus, sidewall spacers 838 are formed on the sides of the gate electrode 832 and sidewall spacers 840 are formed on the sides of the gate electrode 834. In one embodiment, silicon oxide or silicon nitride is deposited using methods known in the art to form the sidewall spacers 838 and 840. In one embodiment, the silicon oxide or silicon nitride is deposited conformally (not shown) and anisotropically etched to form the sidewall spacers 838 and 840 as is known in the art.

In one embodiment, deep implantation is next performed to form deep source and drain regions for each for the P-MOS device 800-P and the N-MOS device 800-N. Source and drain regions 837 are further formed for the P-MOS device 800-P and source and drain regions 839 are further formed for the N-MOS device 800-N. In one embodiment, phosphorous ions are used to implant into the silicon portion 818 to form the source and drain regions 839 for the N-MOS device 800-N. In one embodiment, boron ions are used to implant into the silicon portion 816 to form the source and drain regions 837 for the P-MOS device 800-P.

In FIG. 33, the exposed oxide film 830 not covering by the gate electrodes 832 and 834 and the sidewall spacers 838 and 840 are removed using methods known in the art. The remaining portions of the oxide film 830 form the gate dielectric 830-P for the P-MOS device 800-P and the gate dielectric 830-N for the N-MOS device 800-N. In one embodiment, as shown in FIG. 34, metal silicide regions are formed on the devices using methods known in the art. Thus, silicide regions 842 are formed on the source and drain regions 836 and silicide regions 844 are formed on the source and drain regions 838. Additionally, silicide region 846 is formed on the gate electrode 832 and silicide region 848 is formed on the gate electrode 834. The P-MOS device 800-P and N-MOS device 800-N are thus formed. Other subsequent processes such as creating interconnections to the source and drain regions or multilayer interconnections can also follow.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

I claim:

1. A method comprising:
   providing a silicon substrate having a first portion and a second portion and a crystal lattice orientation of [001]
   forming a rare-earth oxide film on said first portion of said silicon substrate, the rare-earth oxide having a crystal lattice orientation of [110]; and
   depositing a first epitaxial semiconductor film on the rare-earth oxide film, the first epitaxial semiconductor film having a crystal lattice orientation of [110];
   depositing a second epitaxial semiconductor film on said first epitaxial semiconductor film and on said second portion of said silicon substrate wherein said second epitaxial film on said first epitaxial film has a [110]-crystal orientation and said second epitaxial film on said second portion of said silicon substrate has a [001]-crystal orientation.

2. The method of claim 1 wherein the rare-earth oxide film comprises any one of Yttrium oxide, Scandium oxide, Cerium oxide, Lanthanum oxide, Praseodymium oxide, Thorium oxide, and Actinium oxide.

3. The method of claim 1 wherein the first epitaxial semiconductor film includes a [110]-oriented silicon film.

4. The method of claim 3 wherein forming the rare-earth oxide film on the substrate includes depositing the rare-earth oxide film only over said first portion of the substrate, wherein the first semiconductor film is formed over the entire surface of the rare-earth oxide film.

5. The method of claim 4 wherein the rare-earth oxide film comprises any one of Yttrium oxide, Scandium oxide, Cerium oxide, Lanthanum oxide, Praseodymium oxide, Thorium oxide, and Actinium oxide.

6. The method of claim 1 wherein forming the rare-earth oxide film on the substrate includes blanket deposition of the rare-earth oxide film on the substrate, wherein the first epitaxial semiconductor film is formed over the entire surface of the rare-earth oxide film, and wherein the method further comprising:
   removing a portion of the first epitaxial semiconductor film and the rare-earth oxide film.

7. The method of claim 6 further comprising:
   forming a p-type device on the [110]-oriented second epitaxial semiconductor film; and
   forming an n-type device on the [001]-oriented second epitaxial semiconductor film.

8. A method of forming a semiconductor device comprising:
   forming a rare-earth oxide film on a [001]-oriented silicon substrate, the rare-earth oxide having a crystal lattice orientation of [110];
   depositing a [110]-oriented epitaxial silicon film on the rare-earth oxide film;
   providing a portion on the [001]-oriented silicon substrate that does not have the rare-earth oxide and the [110]-oriented epitaxial silicon film;
   depositing a [001]-orientated epitaxial silicon film on said portion of said [001]-orientated silicon substrate that does not have the rare-earth oxide and the [110]-orientated epitaxial silicon film;
   forming an isolation trench, the isolation trench forming between the [110]-oriented epitaxial silicon film and the [001]-orientated epitaxial silicon film;
   forming a p-type device on the [110]-oriented epitaxial silicon film;
   forming an n-type device on the [001]-oriented silicon epitaxial film;
   wherein forming the p-type device and the n-type device further comprising:
   forming a gate dielectric on each of the [110]-oriented epitaxial silicon film and the [001]-oriented epitaxial silicon film;
   forming a gate electrode on each of the gate dielectric;
   forming source and drain regions in the [110]-oriented epitaxial silicon film and the [001]-oriented epitaxial silicon film.

9. The method of claim 8 wherein providing the portion on the [001]-oriented silicon substrate that does not have the rare-earth oxide film and the [110]-oriented epitaxial silicon film further comprising:
   forming the rare-earth oxide film over the entire surface of the [001]-oriented silicon substrate;
   forming the [110]-oriented epitaxial silicon over the entire surface of the rare-earth oxide film; and removing a portion of the [110]-oriented epitaxial silicon and the rare-earth oxide film to provide portion on the [001]-oriented silicon substrate that does not have the rare-earth oxide film and the [110]-oriented epitaxial silicon film.

10. The method of claim 8 wherein providing the portion on the [001]-oriented silicon substrate that does not have the rare-earth oxide film and the [110]-oriented epitaxial silicon film further comprising:

masking a portion of the [001]-oriented silicon substrate with a masking film;

forming the rare-earth oxide film over the [001]-oriented silicon substrate;

forming the [110]-oriented epitaxial silicon over the entire surface of the rare-earth oxide film; and removing the masking film to provide portion on the [001]-oriented silicon substrate that does not have the rare-earth oxide film and the [110]-oriented epitaxial silicon film.

11. The method of claim 8 wherein the rare-earth oxide film comprises any one of Yttrium oxide, Scandium oxide, Cerium oxide, Lanthanum oxide, Praseodymium oxide, Thorium oxide, and Actinium oxide.

\* \* \* \* \*